(12) United States Patent
Greiner et al.

(10) Patent No.: US 7,754,976 B2
(45) Date of Patent: Jul. 13, 2010

(54) COMPACT CIRCUIT CARRIER PACKAGE

(75) Inventors: Ralf Greiner, Wechingen (DE); Josef Maier, Munningen (DE); Kai Paintner, Welden (DE); Richard Sinning, Schnelldorf-Wilden (DE)

(73) Assignee: Hamilton Sundstrand Corporation, Rockford, IL (US)

( * ) Notice: Subject to any disclaimer, the term of this patent is extended or adjusted under 35 U.S.C. 154(b) by 641 days.

(21) Appl. No.: 10/122,766

(22) Filed: Apr. 15, 2002

(65) Prior Publication Data

US 2003/0193786 A1 Oct. 16, 2003

(51) Int. Cl.
*H05K 1/14* (2006.01)
(52) U.S. Cl. ............... 174/259; 174/261; 174/262; 361/790; 361/735
(58) Field of Classification Search ............ 361/712, 361/713, 716, 721, 728, 735, 736, 743, 744, 361/752, 770, 790, 795, 792, 794; 174/250, 174/263, 262, 259, 261; 257/778, 784
See application file for complete search history.

(56) References Cited

U.S. PATENT DOCUMENTS

| | | | |
|---|---|---|---|
| 3,766,634 A | 10/1973 | Babcock, et al. | |
| 3,795,047 A | 3/1974 | Abolafia et al. | |
| 4,039,882 A * | 8/1977 | Kupsky et al. | 313/583 |
| 4,124,926 A * | 11/1978 | Kupsky et al. | 445/24 |
| 4,208,698 A * | 6/1980 | Narasimhan | 361/793 |
| 4,299,873 A | 11/1981 | Ogihara et al. | |
| 4,487,993 A | 12/1984 | Becker | |
| 4,505,418 A | 3/1985 | Neidig et al. | |
| 4,552,607 A * | 11/1985 | Frey | 156/330 |
| 4,563,383 A | 1/1986 | Kuneman et al. | |
| 4,616,413 A * | 10/1986 | Iliou et al. | 29/832 |
| 4,692,843 A * | 9/1987 | Matsumoto et al. | 361/792 |
| 4,788,626 A | 11/1988 | Neidig et al. | |
| 4,803,450 A | 2/1989 | Burgess et al. | |
| 4,849,292 A | 7/1989 | Mizunoya et al. | |
| 4,954,386 A | 9/1990 | Mizunoya et al. | |
| 5,027,255 A | 6/1991 | Zeitlin et al. | |

(Continued)

FOREIGN PATENT DOCUMENTS

DE 41 18 308 A1 12/1992

(Continued)

OTHER PUBLICATIONS

European Search Report completed May 19, 2006 relating to Application No. EP 03 25 2279.

*Primary Examiner*—Dameon E Levi
(74) *Attorney, Agent, or Firm*—Carlson, Gaskey & Olds PC

(57) ABSTRACT

A circuit carrier assembly includes a plurality of substrates directly secured together by an electrically conductive securing substance. In one example, the securing substance is a conductive epoxy. In another example, the electrically conductive securing substance is solder. Still another example includes a combination of solder and conductive epoxy. A non-conductive epoxy provides further mechanical connection and thermal conductivity between the substrates while also electrically isolating selected portions of the substrates in one example. The electrically conductive securing substance not only mechanically secures the substrates together and provides thermal conductivity between the substrates, which increases the thermal capacitance of the assembly, but also establishes at least one electrically conductive path between the substrates.

9 Claims, 2 Drawing Sheets

U.S. PATENT DOCUMENTS

| | | | |
|---|---|---|---|
| 5,041,183 A * | 8/1991 | Nakamura et al. | 156/264 |
| 5,128,831 A * | 7/1992 | Fox, III et al. | 361/396 |
| 5,176,309 A | 1/1993 | Horiguchi et al. | |
| 5,221,417 A * | 6/1993 | Basavanhally | 216/22 |
| 5,434,745 A * | 7/1995 | Shokrgozar et al. | 361/735 |
| 5,579,207 A * | 11/1996 | Hayden et al. | 361/790 |
| 5,583,377 A * | 12/1996 | Higgins, III | 257/707 |
| 5,601,932 A | 2/1997 | Krum et al. | |
| 5,650,662 A | 7/1997 | Edwards et al. | |
| 5,650,755 A * | 7/1997 | Avanic et al. | 331/67 |
| 5,661,087 A * | 8/1997 | Pedersen et al. | 438/109 |
| 5,672,400 A * | 9/1997 | Hansen et al. | 428/40.1 |
| 5,675,180 A * | 10/1997 | Pedersen et al. | 257/685 |
| 5,698,895 A * | 12/1997 | Pedersen et al. | 257/665 |
| 5,708,566 A * | 1/1998 | Hunninghaus et al. | 361/764 |
| 5,786,986 A * | 7/1998 | Bregman et al. | 361/719 |
| 5,812,380 A | 9/1998 | Frech et al. | |
| 5,837,566 A * | 11/1998 | Pedersen et al. | 438/109 |
| 5,839,188 A | 11/1998 | Pommer | |
| 5,920,123 A * | 7/1999 | Moden | 257/774 |
| 5,922,514 A | 7/1999 | Person et al. | |
| 5,926,372 A | 7/1999 | Rinehart et al. | |
| 5,928,568 A | 7/1999 | Paszkiet et al. | |
| 5,936,302 A * | 8/1999 | Pedersen et al. | 257/665 |
| 5,985,464 A | 11/1999 | Schmitt et al. | |
| 5,994,170 A * | 11/1999 | Pedersen et al. | 438/131 |
| 6,022,426 A | 2/2000 | Mennucci et al. | |
| 6,026,564 A * | 2/2000 | Wang et al. | 29/830 |
| 6,034,118 A * | 3/2000 | Bischofberger et al. | 514/431 |
| 6,056,186 A | 5/2000 | Dickson et al. | |
| 6,084,295 A * | 7/2000 | Horiuchi et al. | 257/690 |
| 6,093,477 A | 7/2000 | Matsufusa et al. | |
| 6,098,278 A * | 8/2000 | Vindasius et al. | 29/830 |
| 6,122,170 A | 9/2000 | Hirose et al. | |
| 6,124,633 A * | 9/2000 | Vindasius et al. | 257/685 |
| 6,134,118 A * | 10/2000 | Pedersen et al. | 361/779 |
| 6,188,126 B1 * | 2/2001 | Pedersen et al. | 257/685 |
| 6,208,022 B1 | 3/2001 | Tamura | |
| 6,221,690 B1 * | 4/2001 | Taniguchi et al. | 438/106 |
| 6,239,386 B1 * | 5/2001 | DiStefano et al. | 174/262 |
| 6,247,228 B1 * | 6/2001 | Distefano et al. | 29/830 |
| 6,252,178 B1 | 6/2001 | Hashemi | |
| 6,255,726 B1 * | 7/2001 | Vindasius et al. | 257/686 |
| 6,282,094 B1 * | 8/2001 | Lo et al. | 361/704 |
| 6,288,909 B1 * | 9/2001 | Richardson et al. | 361/796 |
| 6,404,648 B1 * | 6/2002 | Slupe et al. | 361/760 |
| 6,421,253 B1 * | 7/2002 | Ash, Jr. | 361/808 |
| 6,495,771 B2 * | 12/2002 | Gaynes et al. | 174/255 |
| 6,531,022 B1 * | 3/2003 | Tsukahara | 156/256 |
| 6,555,208 B2 * | 4/2003 | Takada et al. | 428/209 |
| 6,582,979 B2 * | 6/2003 | Coccioli et al. | 438/25 |
| 6,831,371 B1 * | 12/2004 | Huemoeller et al. | 257/778 |
| 6,867,493 B2 * | 3/2005 | Hashemi et al. | 257/717 |
| 6,884,833 B2 * | 4/2005 | Chheang et al. | 524/445 |
| 6,960,824 B1 * | 11/2005 | Hashemi et al. | 257/698 |
| 2002/0023341 A1 | 2/2002 | Lorenz et al. | |

FOREIGN PATENT DOCUMENTS

| | | |
|---|---|---|
| EP | 0 723 292 A2 | 7/1996 |
| JP | 04044393 | 2/1992 |
| WO | WO 88/01469 | 2/1988 |

\* cited by examiner

COMPACT CIRCUIT CARRIER PACKAGE

BACKGROUND OF THE INVENTION

This invention generally relates to circuit carrier assemblies having more than one component-supporting substrate. More particularly, this invention relates to circuit carrier assemblies have a conductive securing substance securing a plurality of substrates together to establish an electrically conductive path between the substrates.

There are a variety of ways of assembling power modules for circuit carrier assemblies. Typical arrangements include generally planar substrates aligned beside each other, often in a co-planar orientation. A housing typically is provided over at least portions of the substrates. The housing typically operates to mechanically secure the substrates into positions relative to each other as needed.

Electrical connections between the substrates typically are achieved by soldering pins between pads on the substrates. Such electrical connections, while establishing effective conductive paths, have the drawback of increasing the size of the overall package. Additionally, a shortcoming of the conventional electrical connections is that they did not provide any thermal or mechanical connection between the substrates.

There is a need for an improved arrangement. In many industries, size constraints are becoming increasingly important. Lighter weight, more compact power modules or circuit carrier assemblies are necessary to meet current industry demands.

This invention addresses that need, avoids the shortcomings and drawbacks of the prior art and presents a beneficial improvement.

SUMMARY OF THE INVENTION

In general terms, this invention is a circuit carrier assembly that has an electrically conductive connector securing a plurality of substrates together such that the connector provides a mechanical connection between the substrates that also provides for electrical conductivity between the substrates.

In one example, the substrates have at least one feedthrough opening and the electrically conductive connector is positioned relative to the feedthrough openings such that at least one conductive path between the substrates is established and accessible through the feedthrough openings.

In one example, the conductive connector is a securing substance such as an epoxy. In another example, the conductive connector comprises securing solder. In still another example, the connector comprises a wire bond. Depending on the type of substrate and other manufacturing considerations, the conductive connector may comprise a conductive epoxy, solder, a wire bond or a combination of any two or more of the three.

The connector of the inventive arrangement not only mechanically secures the substrates together, but also establishes at least one electrically conductive path between the substrates. The examples that include a securing substance such as solder or epoxy also provides for thermal conductivity between the substrates, which increases the heat dissipation capacity of the assembly.

In one example, a non-conductive epoxy is provided on at least a portion of the substrates to mechanically secure the substrates together, provide electrical isolation between the substrates at the corresponding portions while also providing for thermal conductivity between the substrates.

The inventive arrangement provides substantial improvement in that the overall size of the assembly is reduced, thermal dissipation capacity is increased and circuit density is increased. In one example, the inventive arrangement is more than fifty percent smaller than a conventional assembly, seventy percent lighter with a greater than forty percent decrease in power dissipation.

The various features and advantages of this invention will become apparent to those skilled in the art from the following detailed description of the currently preferred embodiments. The drawings that accompany the detailed description can be briefly described as follows.

DETAILED DESCRIPTION OF THE PREFERRED EMBODIMENTS

Figure 1:
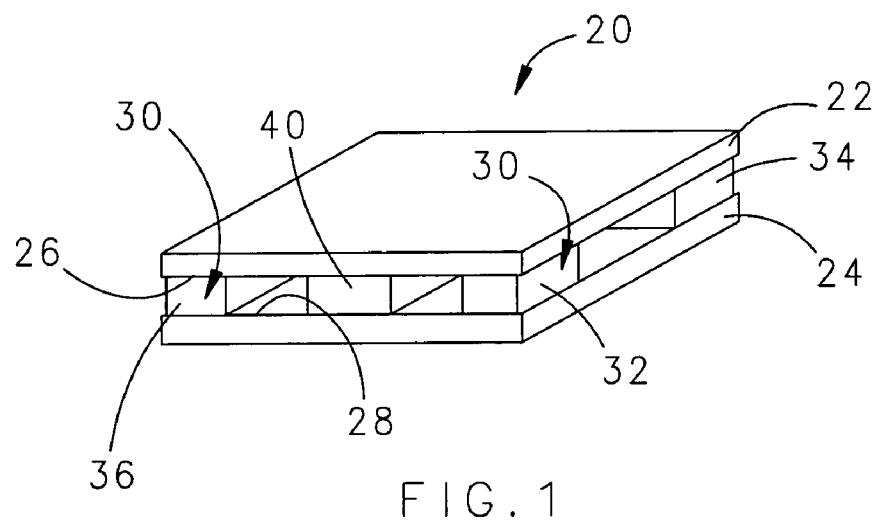
FIG. 1 schematically illustrates a circuit carrier assembly designed according to this invention.

FIG. 1 schematically illustrates a circuit carrier assembly 20 including a first substrate 22 and a second substrate 24. The first substrate 22 has one side 26 facing toward the second substrate 24. Likewise, the second substrate 24 has a side 28 facing the first substrate 22.

The substrates 22 and 24 are mechanically secured together by a conductive connector, which in this example comprises securing substance 30. The illustrated example includes conductive portions 32, 34 and 36 (as visible in the illustration) that provide at least one electrically conductive path between the substrates 22 and 24. The is electrically conductive securing substance 30 in one example comprises a conductive epoxy. A variety of such epoxies are commercially available and, given this description, those skilled in the art will be able to select a suitable one to meet the needs of their particular situation.

In another example, the electrically conductive securing substance 30 comprises solder. Soldering the substrates 24 and 22 together provides a mechanical connection between the substrates while also establishing at least one conductive path between them.

In another example, a combination of a conductive epoxy and solder is used as the electrically conductive securing substance 30.

As can be appreciated from the drawings, the electrically conductive securing substance need not extend across the entire surface of either substrate. Instead, the electrically conductive securing substance may be strategically placed at portions between the substrates where electrically conductive paths are desired.

The illustrated example of FIG. 1 includes a non-conductive epoxy 40 providing a further mechanical connection between the substrates 22 and 24. The non-conductive epoxy 40 and the electrically conductive securing substance 30 not only provide a mechanical connection between the substrates but also establish thermally conductive connections between the substrates. Coupling the substrates together in this manner increases the thermal dissipation capacity of the assembly.

Figure 2:
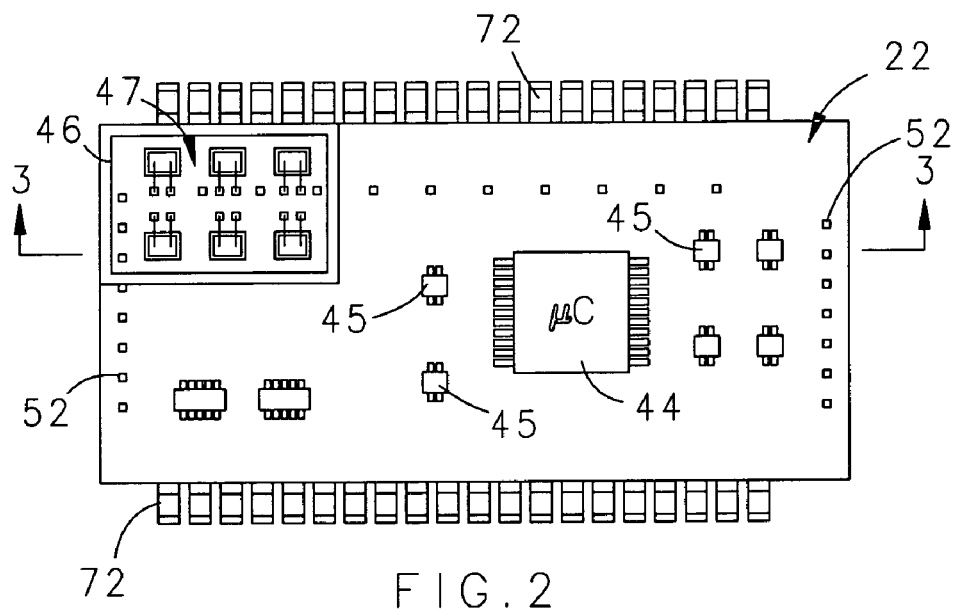
FIG. 2 is a top planar view of an example assembly designed according to this invention.
Figure 3:
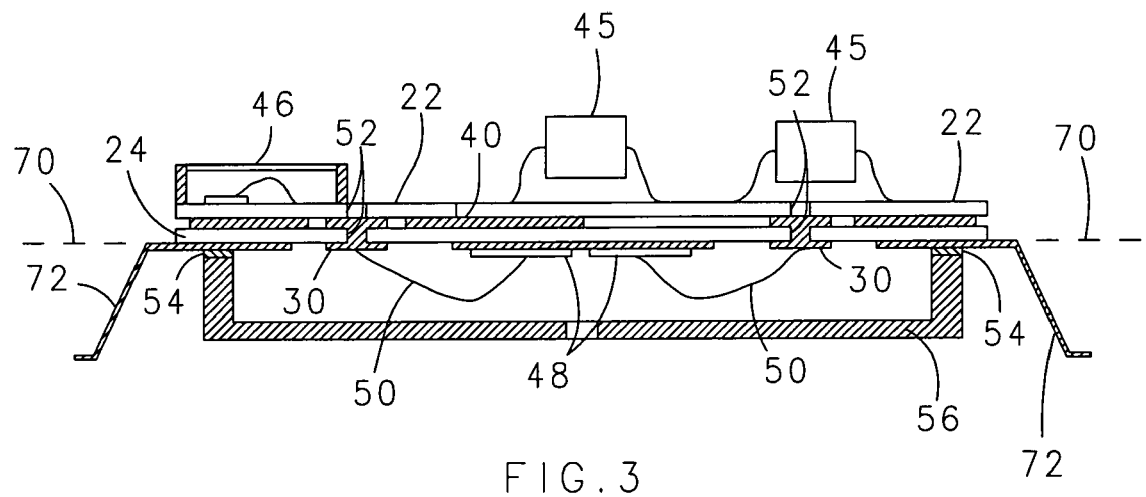
FIG. 3 is a cross sectional illustration taken along the lines 3-3 in FIG. 2.

As can best be appreciated from FIGS. 2 and 3, each substrate preferably is capable of supporting one or more circuit components. In the illustrated example, a microprocessor 44 and a plurality of other components 45 are supported on the first substrate 22. A conventional frame 46 covers a chip and wire section 47 on a portion of the substrate 22. The type of components selected will depend on the needs of a particular situation. The circuit components are supported on the side of the substrate facing away from the adjacent substrate 24.

The substrate 24 supports a plurality of components such as field effect transistors (FET) 48. In the illustrated example, the FET's 48 are electrically coupled to the conductive securing substance 30 using a wire bond 50. Other electrically conductive connections may be used.

The substrates 22 and 24 include a plurality of feedthrough openings 52 that allow the electrically conductive securing substance 30 to be accessible on the outward facing sides of the substrates. This permits a coupling such as the wire bond 50 to link the FET 48 to a desired portion of the circuitry supported on the substrate 22. In this manner, the electrically conductive securing substance 30 establishes an electrically conductive path in a direction perpendicular to the surfaces of the substrates 22 and 24.

While the illustrated example includes a plurality of feedthrough openings 52 on the substrates, it is preferred to place conductive epoxy or solder (i.e., the electrically conductive securing substance 30) only in the vicinity of feedthrough openings where electrically conductive connections are desired.

In situations where only a few such electrically conductive paths are required, a non-conductive epoxy 40 provides further mechanical connection between the substrates and increases the thermal conductivity between the substrates.

While the illustrated example includes the feedthrough openings 52 to establish the electrically conductive path between the substrates, it is possible to include the securing substance 30 close enough to the exterior perimeter of the substrates so that a connection could be made along the outside of the package. Feedthrough openings through the substrates are preferred so that the integrity of the electrical connections is better protected during shipment or handling of the assembly, for example.

The illustrated example includes adhesive 54 securing a housing portion 56 to the substrate 24 to cover over at least selected circuit components on the substrate 24. In the illustrated example, the housing 56 protects the wire bonds 50, for example.

In the example of FIG. 3, the portion above the broken reference line 70 can be considered the control section of the assembly 20. The portion below the line 70 can be considered the power section. Conventional gull wing style terminals 72 facilitate connecting the assembly 20 as needed.

Figure 4:
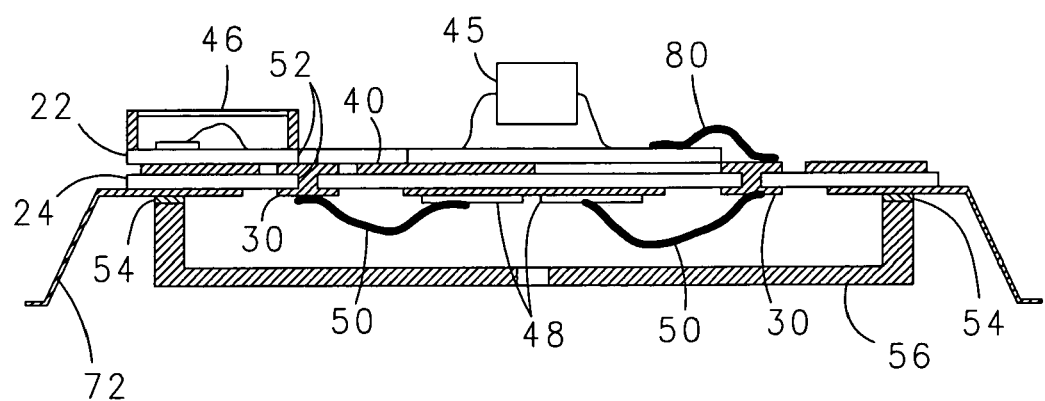
FIG. 4 is a cross sectional illustration similar to FIG. 3 but showing another embodiment of this invention.

The example of FIG. 4 shows a conductive connector that includes a wire bond 80. The illustrated example has the wire bond 80 secured to the substrate 22 and a portion of conductive epoxy 30, respectively. The epoxy 30 electrically couples the wire bond 50 to the wire bond 80 so that an electrically conductive path is established.

Wire bonding is a preferred connection method where a highly reliable connection is desired. Example situations are aircraft applications where vibration levels are high. Another example situation is where a high number of thermal cycles occur.

The substrates 22 and 24 may comprise a variety of materials including direct cooper bonded substrates, thick film ceramic substrates and others. The selection of substrate material will depend, in part, on the desired thermal capacitance of the assembly and the particular circuitry involved for a particular application.

The inventive arrangement presents a substantial improvement over conventional assemblies because the size of the assembly is greatly reduced, in one example, by more than fifty percent. The weight of the overall assembly in one example is at least seventy percent lighter than a conventional assembly having similar circuit characteristics. Not only is the thermal capacitance and circuit density of the assembly increased, but the power dissipation is reduced compared to conventional arrangements, in one example more than forty percent.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A circuit carrier assembly, comprising:
a first generally planar circuit carrier substrate having a first side and a second side;
a second generally planar circuit carrier substrate aligned generally parallel with the first substrate, the second substrate having a first side and a second side;
an electrically conductive epoxy connector securing the first side of the first substrate to the first side of the second substrate and establishing at least one electrically conductive path that extends between the substrates and allows for electrical connections from the oppositely facing second sides of the substrates;
a wire bond at least partially establishing the at least one conductive path; and
at least one feedthrough opening on the first substrate positioned relative to at least a portion of the electrically conductive epoxy connector and a feedthrough opening on the second substrate such that the at least one conductive path is established by at least the portion of the electrically conductive epoxy connector accessible through the feedthrough openings, respectively, and wherein
at least the first substrate comprises a nonconductive material that is exposed at the feedthrough opening on the first substrate such that the electrically conductive epoxy connector directly contacts the nonconductive material of the first substrate.

2. The assembly of claim 1, including a nonconductive epoxy securing at least selected portions of the substrates together and providing a thermally conductive and electrically isolated connection between the corresponding portions of the substrates.

3. The circuit carrier assembly of claim 1, wherein the at least one electrically conductive path extends through each substrate.

4. A circuit carrier assembly, comprising:
a plurality of substrates that are secured to each other by a securing substance that comprises a conductive epoxy, each substrate having at least one feedthrough opening positioned relative to at least a portion of the securing substance and a feedthrough opening on an adjacent substrate such that an electrically conductive connection is established between the substrates by at least the portion of the securing substance accessible through the feedthrough openings, respectively, wherein the substrates comprise a nonconductive material that is exposed at the feedthrough openings such that the conductive epoxy securing substance directly contacts the nonconductive substrate material at the corresponding feedthrough opening; and a nonconductive epoxy bonding at least one other portion of the substrates to each other, the nonconductive epoxy electrically isolating the at least one other portion of the substrates from each other.

5. The assembly of claim 4, wherein the nonconductive epoxy is operative to transfer heat between the substrates.

6. The assembly of claim 4, wherein the electrically conductive connection extends through each of the substrates.

7. A circuit carrier assembly, comprising:

a first generally planar circuit carrier substrate;

a second generally planar circuit carrier substrate aligned generally parallel with the first substrate; and an electrically conductive epoxy directly contacting each of the substrates and securing the first substrate to the second substrate and establishing at least one electrically conductive path that extends through each substrate and between the substrates and allows for electrical connections from oppositely facing sides of the substrates, wherein at least the first substrate comprises a nonconductive material that is exposed at the at least one feedthrough opening such that the conductive epoxy directly contacts the nonconductive material of the first substrate at the at least one feedthrough opening.

8. The assembly of claim 7, including a nonconductive epoxy directly contacting each of the substrates and securing at least selected portions of the substrates together and providing a thermally conductive and electrically isolated connection between the corresponding portions of the substrates.

9. The assembly of claim 7, including at least one feedthrough opening on the first substrate positioned relative to at least a portion of the conductive epoxy and a feedthrough opening on the second substrate such that the at least one conductive path is established by at least the portion of the conductive epoxy accessible through the feedthrough openings, respectively.

\* \* \* \* \*